United States Patent
Barr

(10) Patent No.: US 10,664,714 B2
(45) Date of Patent: May 26, 2020

(54) SUBSTRATE HANDLING AND IDENTIFICATION MECHANISM

(71) Applicant: Rudolph Technologies, Inc., Wilmington, MA (US)

(72) Inventor: Kevin Barr, Inver Grove Heights, MN (US)

(73) Assignee: Rudolph Technologies, Inc., Wilmington, MA (US)

( * ) Notice: Subject to any disclaimer, the term of this patent is extended or adjusted under 35 U.S.C. 154(b) by 190 days.

(21) Appl. No.: 15/850,869

(22) Filed: Dec. 21, 2017

(65) Prior Publication Data

US 2018/0173984 A1  Jun. 21, 2018

Related U.S. Application Data

(60) Provisional application No. 62/437,326, filed on Dec. 21, 2016.

(51) Int. Cl.

| G06K 9/00 | (2006.01) |
|---|---|
| G06K 9/18 | (2006.01) |
| G03F 9/00 | (2006.01) |
| G03F 7/20 | (2006.01) |
| G06K 9/20 | (2006.01) |
| H01L 23/544 | (2006.01) |

(52) U.S. Cl.
CPC ......... *G06K 9/183* (2013.01); *G03F 7/70541* (2013.01); *G03F 7/70775* (2013.01); *G03F 9/7034* (2013.01); *G06K 9/2063* (2013.01); *G06K 2209/19* (2013.01); *H01L 23/544* (2013.01); *H01L 2223/54433* (2013.01)

(58) Field of Classification Search
CPC .... G06K 9/183; G03F 7/70775; G03F 9/7034
See application file for complete search history.

(56) References Cited

U.S. PATENT DOCUMENTS

| 2003/0090640 A1* | 5/2003 | Fujisawa | ................ G03B 27/42 |
| | | | 355/53 |
| 2004/0031779 A1* | 2/2004 | Cahill | .................... B23K 26/04 |
| | | | 219/121.83 |
| 2006/0044540 A1* | 3/2006 | Yun | ..................... G03F 7/70575 |
| | | | 355/67 |
| 2010/0296071 A1* | 11/2010 | Shibazaki | .......... G03F 7/70725 |
| | | | 355/53 |
| 2019/0219936 A1* | 7/2019 | Bijnen | ................. G03F 9/7046 |

* cited by examiner

*Primary Examiner* — Ping Y Hsieh
(74) *Attorney, Agent, or Firm* — Dicke, Billig & Czaja, PLLC

(57) ABSTRACT

A structure and method for employing the structure to reliably read indicia formed on a substrate such as a panel or wafer is disclosed. A gripping member pulls the substrate into at least partial compliance with a locating structure to facilitate the proper function of a code reader. Where the indicia are not read, the substrate is moved relative to the code reader, starting from a position that may be determined based on the material properties of the substrate.

12 Claims, 4 Drawing Sheets

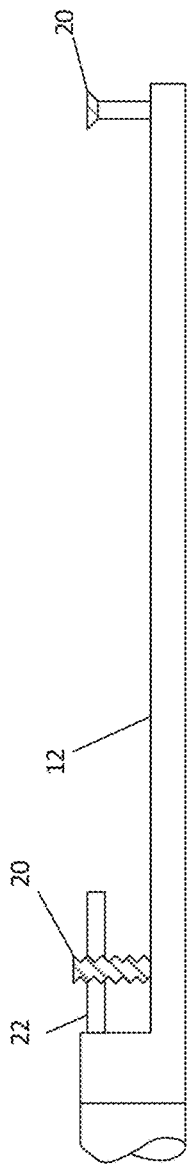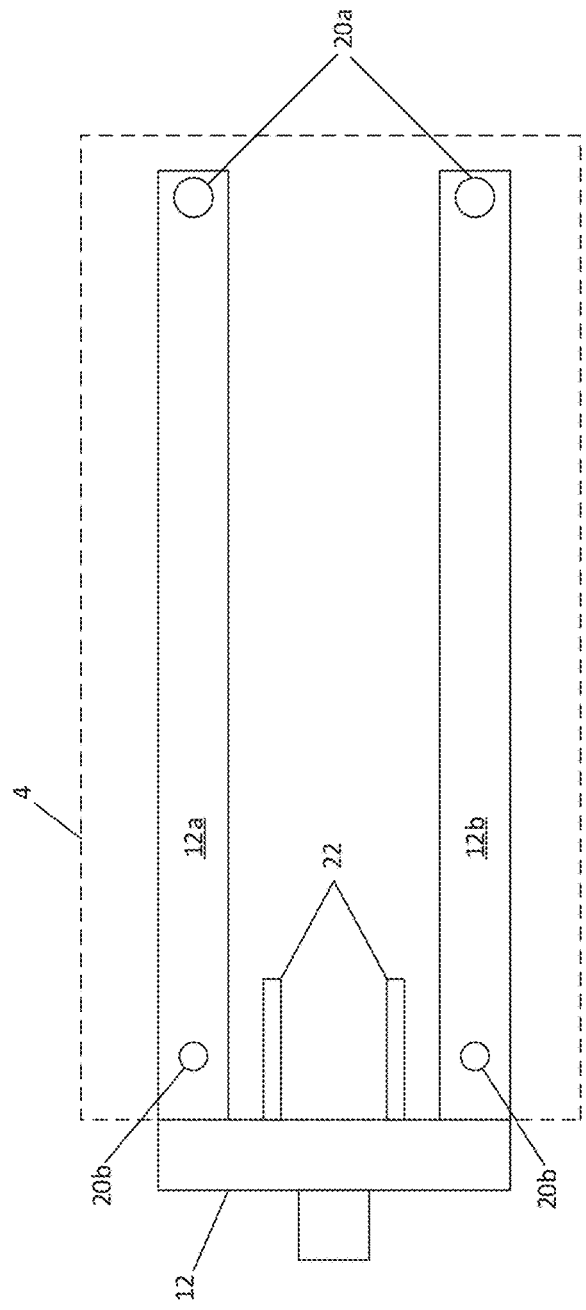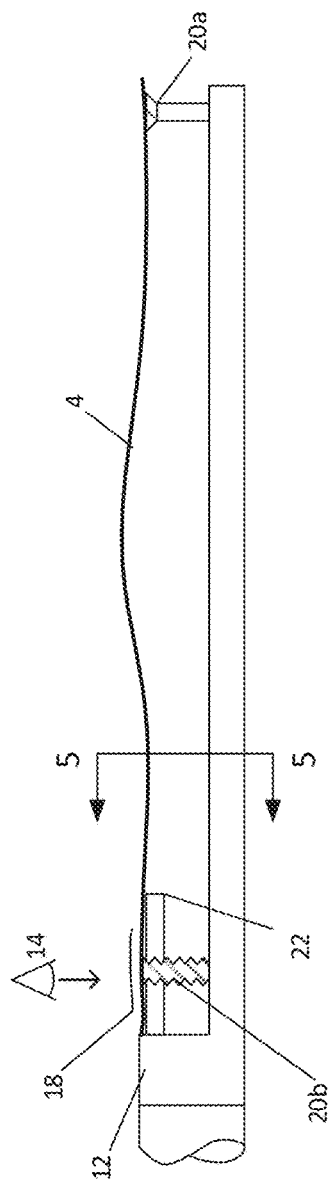

SUBSTRATE HANDLING AND IDENTIFICATION MECHANISM

CROSS REFERENCE TO RELATED APPLICATIONS

This Non-Provisional patent application claims the benefit of the filing date of U.S. Provisional Patent Application Ser. No. 62/437,326, filed Dec. 21, 2016, the entire teachings of which are incorporated herein by reference.

BACKGROUND

The present disclosure relates to the automated handling of thin, nominally planar yet warped substrates that are difficult to manage using typical robotic handling mechanisms.

BRIEF DESCRIPTION OF THE DRAWINGS

FIG. 1 is a side view of one embodiment of an end effector constructed according to the present disclosure.

FIG. 2 is a plan view of the end effector embodiment illustrated in FIG. 1.

FIG. 3 is an illustration of the end effector embodiment illustrated in FIG. 1 shown holding a substrate.

DETAILED DESCRIPTION

Figure 4:
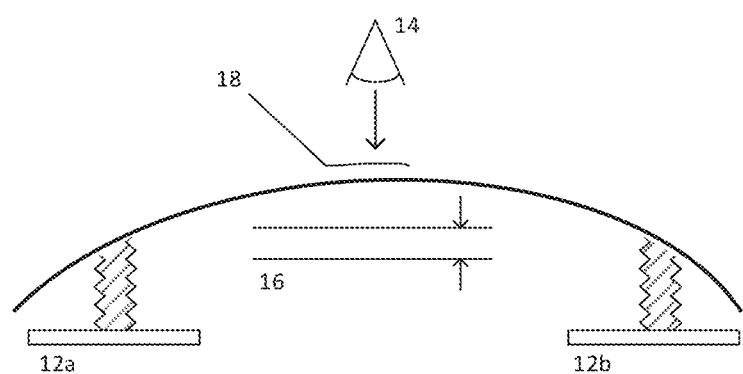
FIG. 4 represents a common problem in which a surface of a warped substrate having an identifying mark is positioned outside of the depth of field of an imaging or other sensor.

In the following detailed description, reference is made to the accompanying drawings that form a part hereof, and in which is shown, by way of illustration, specific embodiments in which the aspects of the present disclosure may be practiced. In the drawings, like numerals describe substantially similar components throughout the several views. These embodiments are described in sufficient detail to enable those skilled in the art to practice the present disclosure. Other embodiments may be utilized and structural, logical, and electrical changes may be made without departing from the scope of the present disclosure. The following detailed description is, therefore, not to be taken in a limiting sense, and the scope of the present disclosure is defined only by the appended claims and equivalents thereof.

Figure 6:
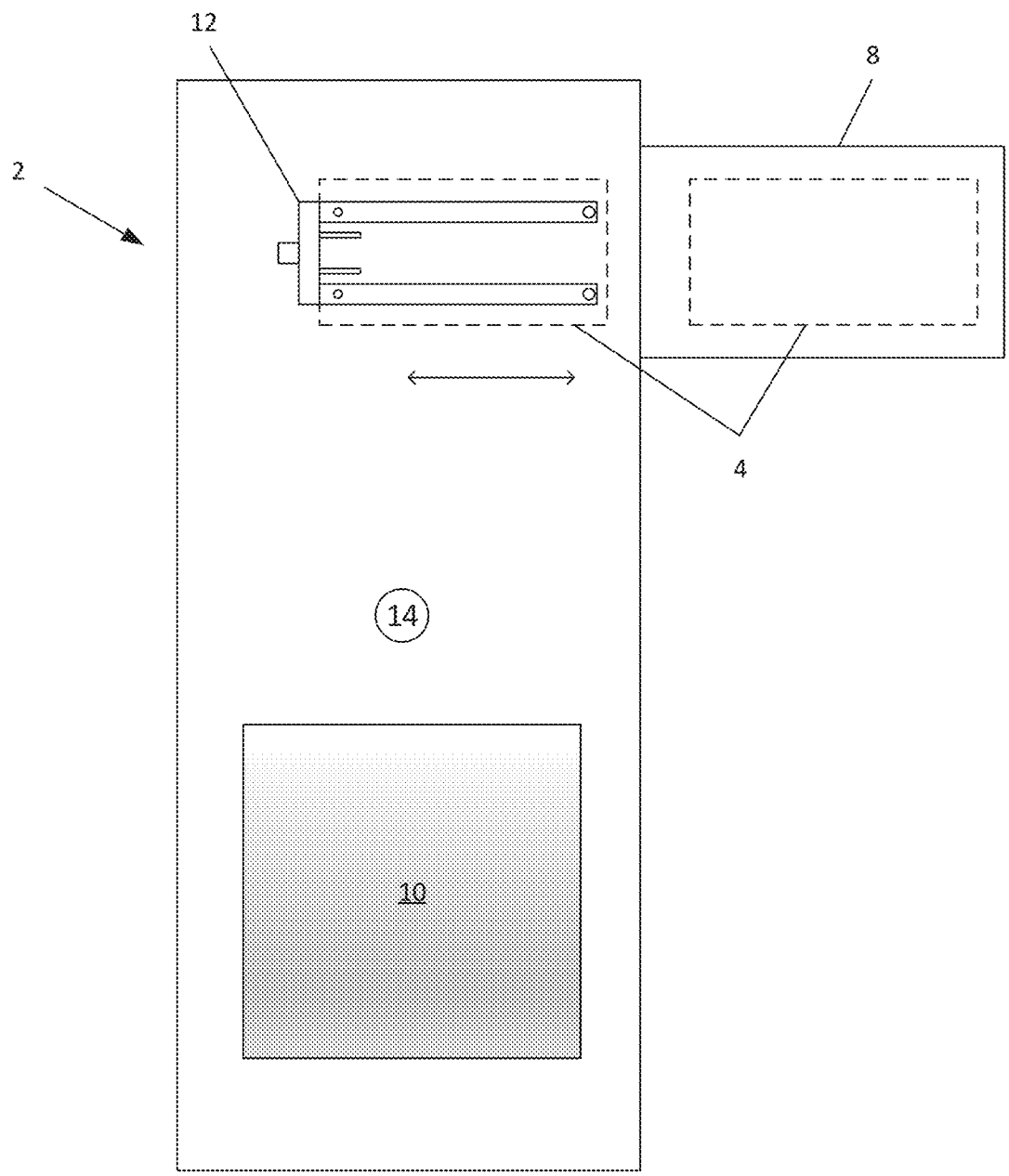
FIG. 6 is a plan view of an exemplary handling application in which an end effector constructed according to the present disclosure may be employed.

Turning first to FIG. 6 there can be seen a schematic representation of a system 2 for performing some operation on or with a substrate 4. As described herein the substrate 4 is a flat panel of silicon, glass, composite materials, sapphire, and indium gallium arsenide (InGaAs) or the like. The substrate 4 may be of any useful size or aspect ratio. One common set of sizes used in the optical glass and flat panel display industries is the generation or "GEN" sizing. For example, a GEN 4 substrate would be approximately 680 mm×880 mm. Note that features of the present disclosure may be used with silicon or other types of wafers or substrates as well.

System 2 involves the movement of substrates 4 from an input station 8 to a tool 10 that performs some task or process with or to the substrate 4. In one embodiment, input station 8 includes a cassette that holds one or more nominally planar substrates 4. Input stations 8 of various types are well known. The tool 10 may be any type of mechanism that modifies, measures, or inspects a substrate 4.

A robot (not shown) within the system 2 has a handling mechanism or end effector 12 for transporting substrates 4 from the input station 8 to the tool 10 and vice versa. End effectors 12 are relatively thin to fit between respective stacked substrates 4 stored at the input station 8. End effectors 12 generally also utilize some sort of pneumatic gripping members (positive or negative pressures). Such gripping members work best when the substrate 4 is as close to planar as is possible. But where the nature of the substrate 4 results in a non-planar shapes, the operation of the system 2 may be negatively affected. For example, a code reader 14 may be placed in the system 2 to keep track of the identity of each substrate 4 that is processed by the system 2. Where a substrate 4 is significantly non-planar, it can be difficult for the code reader 14 to read a code on the substrate 4.

FIG. 4 shows a substrate 4 that is non-planar. Note that the lack of planarity is exaggerated in this Figure for explanatory purposes. As can be seen, the code reader 14, which is in this instance an electronic imaging sensor, has a depth of field 16. If a mark 18 on the substrate 4 is within the depth of field 16, the code reader 14 can obtain a clear image of the mark 18 and the substrate 4 is logged by the system 2 (FIG. 6). Where, as in the Figure, the mark 18 is outside of the depth of field 16, no data regarding the identity of the substrate 4 is obtained. The present disclosure is directed to structures and methods for enabling the collection of useful data from marks 18 by code readers 14.

FIG. 1 is a side view of an end effector 12 that includes an embodiment of the present disclosure. As can be seen, the end effector 12 is relatively thin in a vertical direction so as to fit between individual substrates 4 (not shown) stacked at an input station 8 (FIG. 6). As is known to those skilled in the art, the end effector 12 is inserted between substrates 4, moved upward to engage gripping members 20 with the substrate 4 and to lift the substrate 4 off of a support (not shown) upon which it rests. In the present embodiment, this gripping members 20 apply vacuum to the substrate 4 to firmly grip the substrate 4. The end effector 12 is then withdrawn from the input station 8, bringing a substrate therewith. The robot (not shown) that supports and moves the end effector 12 then addresses the substrate 4 to the code reader 14 so that the mark 18 (FIG. 4) may be viewed. This is generally an intermediate step inserted into the step of moving a substrate 4 from an input station 8 to a tool 10 (FIG. 6).

In FIG. 2 can be seen a plan view of one embodiment of the present disclosure. Note that in this embodiment the end effector 12 is configured with two fingers 12a, 12b in a forked arrangement, with each finger 12a, 12b including or carrying a forward gripping member 20a and a rear gripping member 20b. This permits the end effector 12 to support a substrate 4 that is relatively wide, e.g. a large panel. Substrate 4 is shown in dashed line in FIG. 2.

FIG. 3 illustrates the end effector 12 from the side and shows a substrate 4 secured thereto by gripping members 20. The mark 18 is formed into the surface of the substrate 4. The mark 18 is positioned beneath a code reader 14 which images the mark 18 to identify the substrate 4 to the system 2 (FIG. 6) or to a fab-wide system (not shown) that controls the operation of multiple systems 2 in a fabrication facility.

The forward gripping members 20a are in the illustrated embodiment of a fixed height. The rear gripping members 20b are variable in height and in a first, undeployed state are generally higher than the forward gripping members 20a. More importantly, the rear gripping members 20b will be, in this first state, higher than locating posts 22. Locating posts 22 extend generally parallel to the fingers 12a, 12b (FIG. 2) of the end effector 12. The locating posts 22 define a surface upon which the substrate 4 rests when the substrate is gripped by the end effector 12. In this embodiment the locating posts 22 are separate entities. It is to be understood that other numbers of locating posts or equivalent structures may be used in lieu of the posts 22. Three or more posts may work quite well in some embodiments and in others, a single locating structure having one or more surfaces that contact the substrate 4 may be used.

Figure 5:
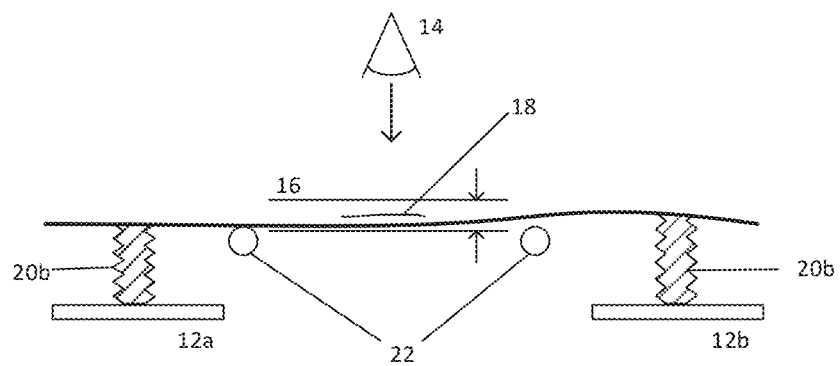
FIG. 5 is a schematic representation of how the present disclosure ameliorates the problem illustrated in FIG. 4.

FIG. 5 shows the function of the locating posts 22 in locating the surface of the substrate 4 relative to a depth of field 16 of the code reader 14. In the prior art end effector shown in FIG. 4 there is no surface into which the rear gripping members 20b can pull the substrate 4, which is in this illustration quite bowed. As the rear gripping members 20b telescope when in a second state in which they are addressed to a substrate 4 and when a vacuum is applied thereto, there is no way of determining whether the surface of the substrate 4 which has the mark 18 will be positioned within the depth of field 16 of the code reader 14. Where rear gripping members 20b are used in conjunction with the locating posts 22, some certitude as to the position of the mark 18 relative to the depth of field 16 may be achieved. The telescopic action of the rear gripping members 20b will bring the substrate 4 into contact with the locating posts 22. Together with the fixed, forward gripping members 20a (FIG. 3), the substrate 4 is nominally located in a position in which the mark 18 is likely to be found within the depth of field 16 of the code reader 14.

Figure 7:
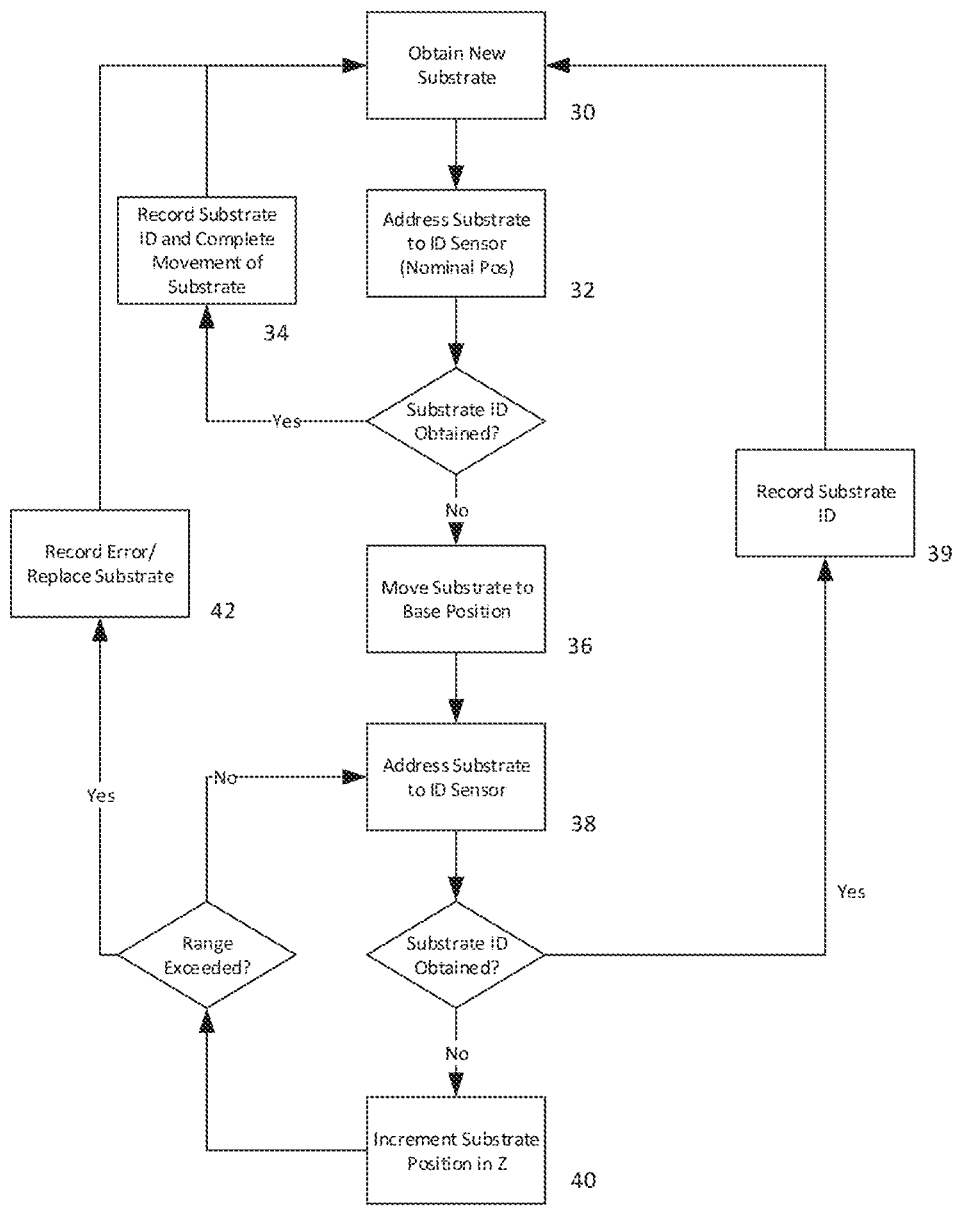
FIG. 7 is a flowchart of a process in accordance with principles of the present disclosure.

Given that some substrates may be quite bowed or warped, it is sometimes the case that even with locating posts 22 it may be difficult to obtain good data from the mark 18. In this instance a process for ensuring that the mark 18 is at some point within the depth of field 16 of the code reader 14 is followed. One embodiment of this process is illustrated in FIG. 7. In this process a substrate 4 is obtained from the input station 8 at step 30. The end effector 12 then addresses the substrate 4 to the code reader 14 in step 32. Where the mark 18, which is generally a substrate ID of some sort such as bar code, is properly read, the substrate ID is recorded (step 34) and the movement of the substrate 4 is completed. Note that this movement may involve placing the substrate 4 on the tool 10 for processing.

Where the mark 18 is not successfully read, the end effector 12 will be moved to a base position (step 36). In the base position the mark 18 is positioned with the lateral extents of the field of view of the code reader 14. The base position is the lowest vertical position of the end effector 12 at which one could reasonably expect the mark 18 to be within the depth of field of the code reader 14. For example, a warped substrate having an upward bow (such as that seen in FIG. 4) will position the mark 18 above the nominal surface defined by the locating posts 22. The base position here then is one in which the end effector 12 is low enough to ensure that the mark 18 is within the depth of field 16 of the code reader 14. While the amount of warp, bow or other misshapenness is variable and somewhat random, one can predict a value based on the yield stress of the substrate 4. For example, the ultimate stress of patterned silicon substrates may be as low as 300 MPa. Further, substrates 4 must be flat during most processing steps. Where the stress induced in a warped silicon substrate 4 during the flattening process exceeds about 300 MPa, it is likely that the substrate will break. Accordingly, one may determine the maximum amount of warpage that can be physically overcome without exceeding an ultimate strength for the material of which the substrate 4 is fashioned; the vertical dimension of the maximal warpage may then be used as an indication of the base position for the end effector 12 in step 36. Since time is usually to be minimized in the processing of substrates 4, selecting a base position that is likely to obtain a good result in the shortest time is highly valued. As a result, where experience determines that the aforementioned computed base position is too far outside of the position where the mark 18 is generally located, then a base position related to the statistical position of the mark 18 may be used, e.g. a base position that encompasses the mark 18 within the depth of field 16 a statistically acceptable percentage of the time may be chosen. Upon initial set up of a system 2 wherein the foregoing determinations have not been made, an arbitrary base position may be determined and monitored to assess its utility.

In step 38 the code reader 14 again queries the substrate 4 to obtain the data associated with the mark 18. If the mark 18 is read by the code reader 14, then the data associated therewith is recorded as at step 39. If the mark 18 is not found, then the end effector 12 is moved upward toward the code reader 14 by a predetermined distance as at step 40. This process is continued until the mark 18 is found by the code reader 14 or the position of the end effector 12 exceeds a predetermined limit or range. If the range is exceeded, an error is recorded and the substrate 4 is returned to the input station 8 as at step 42. The recorded error may indicate that the mark 18 was somehow corrupted or that the substrate 4 was out of specification regarding its warpage. The entire process illustrated in FIG. 7 continues until no more substrates 4 are available.

Although specific embodiments of the present disclosure have been illustrated and described herein, it will be appreciated by those of ordinary skill in the art that any arrangement that is calculated to achieve the same purpose may be substituted for the specific embodiments shown. Many adaptations of the present disclosure will be apparent to those of ordinary skill in the art. Accordingly, this application is intended to cover any adaptations or variations of the present disclosure. It is manifestly intended that the present disclosure be limited only by the following claims and equivalents thereof.

What is claimed is:

1. A method of reliably reading a mark on a warped substrate comprising:
    engaging a warped substrate using an end effector provided with a locating member and a gripping member;
    gripping the warped substrate with the gripping member such that the warped substrate is at least partially forced into compliance with the locating member, the mark of the warped substrate being positioned substantially within a depth of field of a reader; and,
    reading the mark from the warped substrate using the reader.

2. The method of reliably reading a mark on a warped substrate of claim 1 further comprising:
    determining whether the reader has read the mark on the warped substrate;
    placing the warped substrate to a base position where the reader has not successfully read the mark on the warped substrate;

moving iteratively the warped substrate relative to the reader until the reader is able to read the mark on the warped substrate or until a position range of the warped substrate has been exceeded.

3. The method of reliably reading a mark on a warped substrate of claim 2 wherein the base position is determined using an ultimate yield strength of the material from which the substrate is formed.

4. The method of reliably reading a mark on a warped substrate of claim 2 wherein the warped substrate is formed of a material selected from a group consisting of silicon, glass, composite materials, sapphire, and indium gallium arsenide (InGaAs).

5. The method of reliably reading a mark on a warped substrate of claim 1, wherein the mark is a substrate ID that identifies the warped substrate.

6. The method of reliably reading a mark on a warped substrate of claim 5, wherein the substrate ID is a bar code.

7. The method of reliably reading a mark on a warped substrate of claim 5, further comprising recording the read substrate ID.

8. The method reliably reading a mark on a warped substrate of claim 1, further comprising:
operating the end effector to remove the warped substrate from a cassette of substrates following the step of engaging and prior to the step of gripping.

9. The method of reliably reading a mark on a warped substrate of claim 8, further comprising:
operating the end effector to deliver the warped substrate to a tool following the step of reading, wherein the tool is configured to perform at least one of modifying, measuring and inspecting the warped substrate.

10. The method of reliably reading a mark on a warped substrate of claim 1, wherein the gripping member is a rear gripping member, the rear gripping member being proximate the locating member, and wherein the end effector further comprising a forward gripping member opposite the rear gripping member, and further wherein the step of engaging includes engaging the warped substrate at a contact face the rear gripping member and at a contact face of the forward gripping member, and even further wherein the step of gripping include manipulating the contact face of the rear gripping member relative to the locating member.

11. The method of reliably reading a mark on a warped substrate of claim 10, wherein the step of gripping further includes the surface of the forward gripping member remaining spatially fixed during the step of manipulating the contact face of the rear gripping member relative to the locating member.

12. The method of reliably reading a mark on a warped substrate of claim 1, wherein the gripping member extends from an upper surface of a finger to a contact face, and further wherein a locating member is held at a fixed height relative to the upper surface, and even further wherein the step of gripping includes retracting the contact face toward the upper surface from a first height that is greater than the fixed height to a second height that is less than the first height.

* * * * *